(12) United States Patent
Mitteer et al.

(10) Patent No.: US 9,831,580 B2
(45) Date of Patent: Nov. 28, 2017

(54) VEHICLE-MOUNTED SENSORLESS MOTOR WITH EDGE-CONNECTED TERMINATION

(71) Applicant: GHSP, Inc., Grand Haven, MI (US)

(72) Inventors: David Michael Mitteer, Shelby, MI (US); Bradley John Vecellio, Spring Lake, MI (US)

(73) Assignee: GHSP, Inc., Grand Haven, MI (US)

( * ) Notice: Subject to any disclaimer, the term of this patent is extended or adjusted under 35 U.S.C. 154(b) by 0 days.

(21) Appl. No.: 15/264,782

(22) Filed: Sep. 14, 2016

(65) Prior Publication Data

US 2017/0077631 A1    Mar. 16, 2017

Related U.S. Application Data

(60) Provisional application No. 62/218,632, filed on Sep. 15, 2015.

(51) Int. Cl.

| | |
|---|---|
| *H01R 12/72* | (2011.01) |
| *H01R 12/73* | (2011.01) |
| *H01R 12/52* | (2011.01) |
| *H02K 11/00* | (2016.01) |
| *H01R 12/55* | (2011.01) |
| *H01R 12/71* | (2011.01) |
| *H01R 12/58* | (2011.01) |
| *H01R 13/11* | (2006.01) |

(52) U.S. Cl.
CPC .......... *H01R 12/728* (2013.01); *H01R 12/52* (2013.01); *H01R 12/55* (2013.01); *H01R 12/714* (2013.01); *H01R 12/72* (2013.01); *H01R 12/737* (2013.01); *H02K 11/0094* (2013.01); *H01R 12/585* (2013.01); *H01R 12/722* (2013.01); *H01R 13/112* (2013.01); *H01R 2201/26* (2013.01)

(58) Field of Classification Search
CPC ....... H01R 12/55; H01R 12/72; H01R 12/728
See application file for complete search history.

(56) References Cited

U.S. PATENT DOCUMENTS 3,764,955 A * 10/1973 Ward ..................... H05K 3/366
                                                        439/377
3,790,916 A *  2/1974 Keitel ................... H05K 3/3405
                                                        439/435

(Continued)

FOREIGN PATENT DOCUMENTS

EP         2615725 A2     7/2013

OTHER PUBLICATIONS

International Search Report and Written Opinion of the International Seaching Authority, or the Declaration; International Application No. PCT/US2016/051874; dated Dec. 1, 2016; pp. 1-7.

*Primary Examiner* — James Harvey
(74) *Attorney, Agent, or Firm* — Price Heneveld LLP

(57) ABSTRACT

An apparatus electrically connects a motor's on-board stator circuit board to multiple circuits on a controller circuit board using an edge connector on the controller circuit board that engages opposing pads on an edge of the stator circuit board. The edge connector includes tuning-fork-like conductors each with pairs of protruding arms positioned to both engage the pads for electrical contact and also frictionally engage the pads for mechanical retention. A related method of assembly uses the edge-connect system for quick, reliable and sure assembly even under blind assembly conditions.

10 Claims, 8 Drawing Sheets

(56) References Cited

U.S. PATENT DOCUMENTS

| | | | |
|---|---|---|---|
| 4,085,998 A * | 4/1978 | Owens | H01R 12/728 |
| | | | 439/59 |
| 5,770,902 A | 6/1998 | Batten et al. | |
| 6,484,598 B2 | 11/2002 | Peter | |
| 6,688,892 B2 * | 2/2004 | Fukumoto | H01R 13/04 |
| | | | 439/65 |
| 6,756,711 B2 | 6/2004 | Matsuyama et al. | |
| 7,108,543 B2 | 9/2006 | Higashide | |
| 7,417,342 B2 | 8/2008 | Engesser et al. | |
| 7,484,992 B2 | 2/2009 | Boischio | |
| 8,120,216 B2 | 2/2012 | Sakata | |
| 8,193,678 B2 | 6/2012 | Horng et al. | |
| 8,569,917 B2 | 10/2013 | Tang et al. | |
| 8,696,326 B2 | 4/2014 | Hadar et al. | |
| 8,957,559 B2 | 2/2015 | Schneider et al. | |
| 9,077,231 B2 | 7/2015 | Ozaki et al. | |
| 9,088,198 B2 | 7/2015 | Tang et al. | |
| 9,115,720 B2 | 8/2015 | Rosinski et al. | |
| 2001/0000768 A1 * | 5/2001 | Robinson | G01R 11/04 |
| | | | 439/517 |
| 2003/0098660 A1 | 5/2003 | Erdman et al. | |
| 2012/0194112 A1 | 8/2012 | Purohit | |
| 2013/0315752 A1 | 11/2013 | Blaser | |
| 2013/0328459 A1 | 12/2013 | Blaser | |
| 2014/0132095 A1 | 5/2014 | Aoki et al. | |
| 2014/0354117 A1 | 12/2014 | Ishihara et al. | |
| 2015/0083649 A1 | 3/2015 | Rosinski | |
| 2015/0091401 A1 | 4/2015 | Buerger et al. | |
| 2015/0252808 A1 | 9/2015 | Rosinski et al. | |
| 2017/0077631 A1 * | 3/2017 | Mitteer | H01R 12/737 |

\* cited by examiner

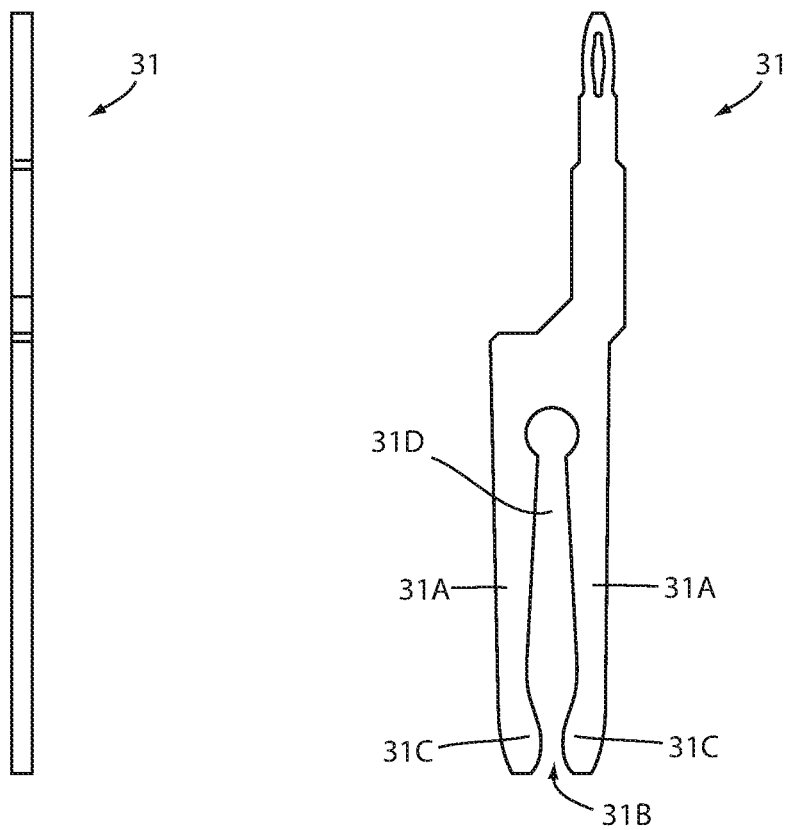
FIG. 6
FIG. 7
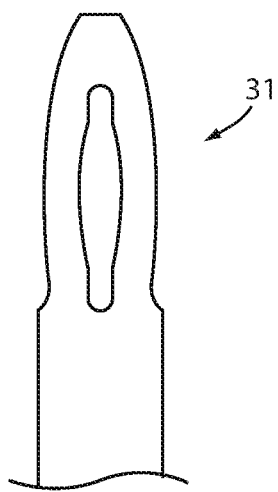
FIG. 8

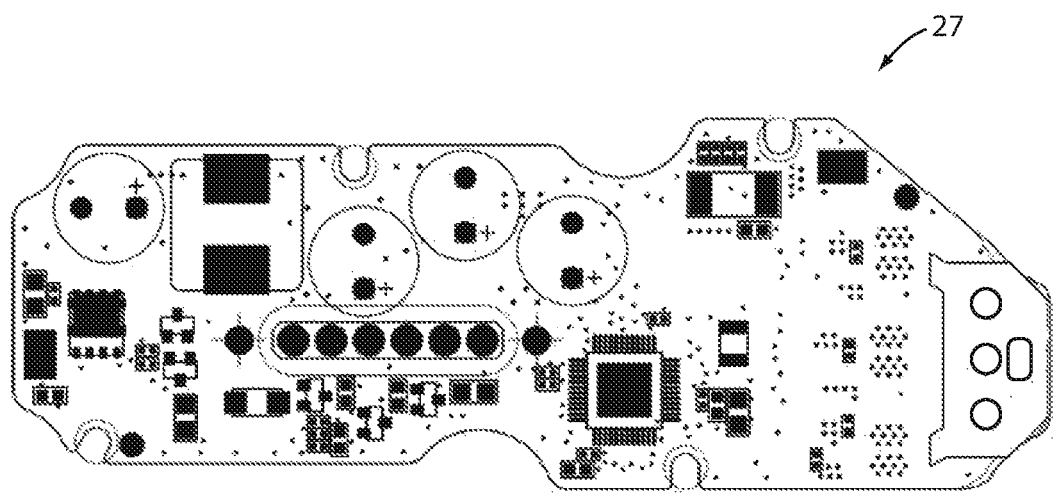
FIG. 14
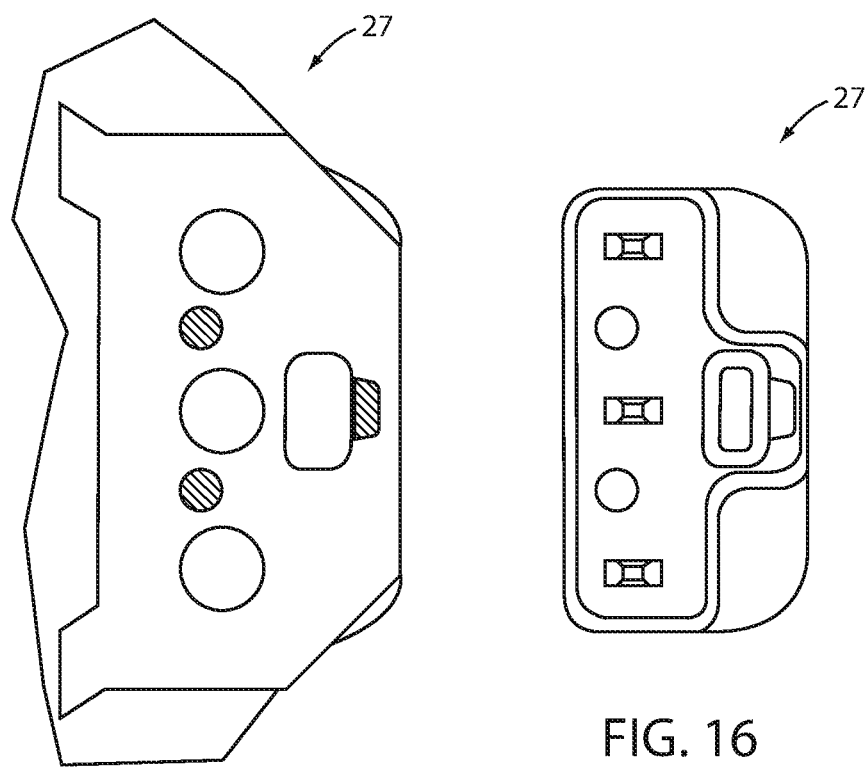
FIG. 15
FIG. 16

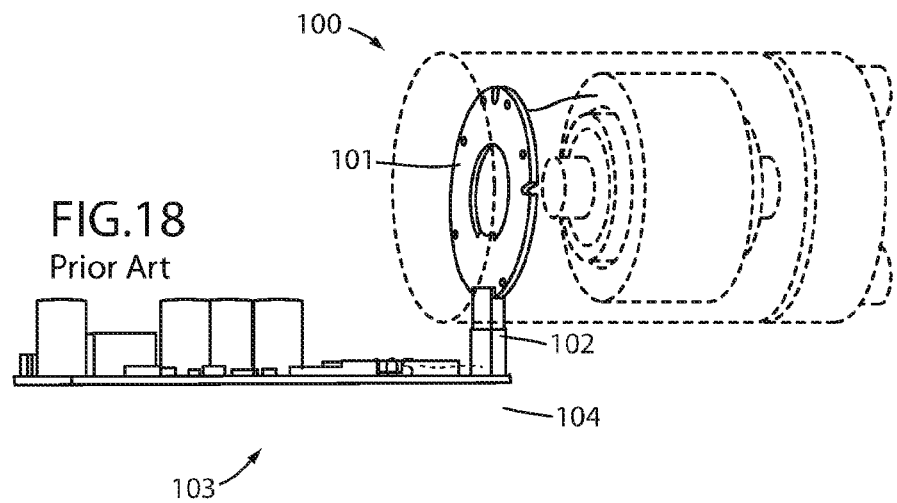
FIG.18
Prior Art
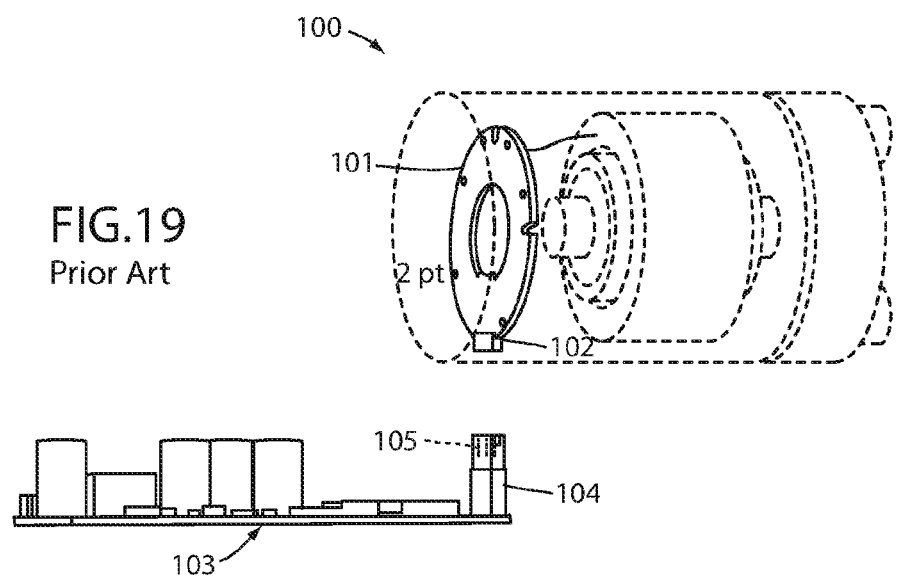
FIG.19
Prior Art
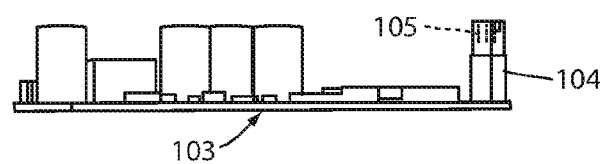
FIG.20
Prior Art
FIG.21
Prior Art his application claims benefit under 35 USC section 119(e) to U.S. Provisional Application No. 62/218,632, filed on Sep. 15, 2015, entitled VEHICLE-MOUNTED SENSORLESS MOTOR WITH EDGE-CONNECTED TERMINATION, the entire disclosure of which is incorporated herein by reference.

BACKGROUND

The present invention relates to a vehicle-mounted sensorless motor apparatus with a motor termination connector for motor phases U, V, and W; and more particularly relates to a motor having a stator circuit board integral to the motor, a controller circuit board separate from the stator circuit board, and mating connectors for connecting circuits between the circuit boards for controlling the motor phases U, V, and W. The present innovation is well adapted for use in an automatic transmission fluid pump/motor apparatus, but is not believed to be limited to only that use.

Sensorless automatic transmission fluid (ATF) motors can be used to drive pumps for pumping automatic transmission fluid on a vehicle. Such motors are useful for several reasons, including their compact design, reliability, control, and cost effectiveness. Sensorless ATF motors typically have a connector-based termination on the circuit boards for phases U, V, and W, so that a controller circuit board can control circuits defined in part by the stator circuit board for operating the motor's rotor. It is important that the assembly be compact, but also easily connected (since the assembly may be a blind assembly), reliably connected (including good and consistent electrical contact and that is also mechanically resistant to pull-apart), and assembled with a minimum of components and lower cost component (for competitive reasons).

One example of prior art is shown in FIGS. 18-21, which illustrates an ATF motor 100 connected to a pump positioned inside a transmission fluid pan for pumping pooled automotive transmission fluid as needed to vehicle components. The motor 100 includes a stator circuit board 101 with a first multi-point (female) connector 102 (sometimes called "terminal header") soldered to the board 101, and a controller circuit board 103 having a mating second multi-point (male) connector 104 (sometimes called a "socket header") soldered to the board 103, with the mating connectors 102 and 104 having mating pin and sockets for connecting different circuits between the circuit boards 101 and 103 for controlling phases U, V, and W of the motor 100 to rotate the motor's rotor. The connector 102 is soldered into the electronics in the stator circuit board 101, and the connector 104 is soldered to the electronics of the controller circuit board 103, which adds significant expense and is a quality concern. The male connector 104 includes multiple miniaturized parallel pins 105 adapted to fit snugly into mating sockets for electrical connection. The pins are designed to be as small as possible to meet space/size, weight, and functional requirements, since the space within the transmission fluid pan is small, but concurrently must be sufficiently large for good surface area for providing electrical connection. The connectors 102 and 104 both include metal conductors held by non-conductive material (such as plastic), with the non-conductive material being designed to assist with accurate alignment of the pins and sockets during assembly and interconnection, but also providing good retention strength after assembly. A quality problem occurs when one or more of the pins are deformed or damaged during assembly, resulting in poor (or no) electrical connection. This problem is compounded by the blind assembly, and by the small size and low bending strength of the pins. Improvement is desired to simplify the assembly, lower cost, improve assemble-ability (especially during a blind assembly), improve reliability of retention after assembly, improve integrity and reliability of the electrical connection made in the multiple circuits during assembly, doing so while maintaining low cost of components and assembly, and while also providing a design that takes up as small of space as possible by the components/assembly.

SUMMARY OF THE PRESENT INVENTION

In one aspect of the present invention, an apparatus for electrically connecting a motor's on-board stator circuit board to a controller circuit board, comprises: A) one of the stator circuit board and the controller circuit board including an edge with spaced-apart pads of electrically-conductive material for connecting to the multiple electrical circuits; and B) the other the stator circuit board and the controller circuit board including an edge connector with conductors each having at least one protruding arm positioned to both engage the pads for electrical contact and also frictionally engage the pads for mechanical retention.

In narrower aspects, the pads include first pads on one side and second pads on an opposite side that are aligned with the first pads; and the at least one protruding arm on each of the conductors includes opposing arms that define a pinch point therebetween, the pinch point being dimensioned to cause the opposing arms to each contact an associated one of the pads.

In another narrower aspect, the apparatus does not include any mechanical connecting structure creating a substantial retention force other than the retention force created by the conductors on the pads.

In another narrower aspect, the pads include duplicative pads on opposite sides of the circuit board, both connected to the electrical circuit, thus leading to a duplicative connection that is more reliable and robust.

In another aspect of the present invention, a method for electrically connecting a motor's on-board stator circuit board to a controller circuit board, comprises: A) providing on one of the stator circuit board and the controller circuit board, an edge with spaced-apart pads of electrically-conductive material for connecting to the multiple electrical circuits; B) providing on the other the stator circuit board and the controller circuit board, an edge connector with conductors each having at least one protruding arm positioned to both engage the pads; and C) assembling the edge connector onto the edge so that the conductors electrically engage the pads for electrical contact and also frictionally engage the pads for mechanical retention.

These and other aspects, objects, and features of the present invention will be understood and appreciated by those skilled in the art upon studying the following specification, claims, and appended drawings.

BRIEF DESCRIPTION OF DRAWINGS

FIGS. 6-8 are views of one of the tuning-fork-like conductors, FIGS. 6-7 being side and plan views, FIG. 8 being an enlarged view of the circuit-board-attached pin on the conductor.

FIG. 14 is a plan view of the stator circuit board of FIGS. 1 and 2.

FIGS. 15-16 are enlarged views of opposing sides of the end of the controller circuit board where the edge connector engages the controller circuit board.

FIGS. 18-19 are side views of prior art, FIG. 18 showing a stator circuit board assembled to a controller circuit board by a male terminal header connector (with circumferential shield around projecting pins) and socket header connector, FIG. 19 being an exploded view of same.

FIGS. 20 and 21 are perspective views of the socket header connector and terminal header connector shown in FIGS. 18-19.

DETAILED DESCRIPTION OF PREFERRED EMBODIMENTS

Figure 1:
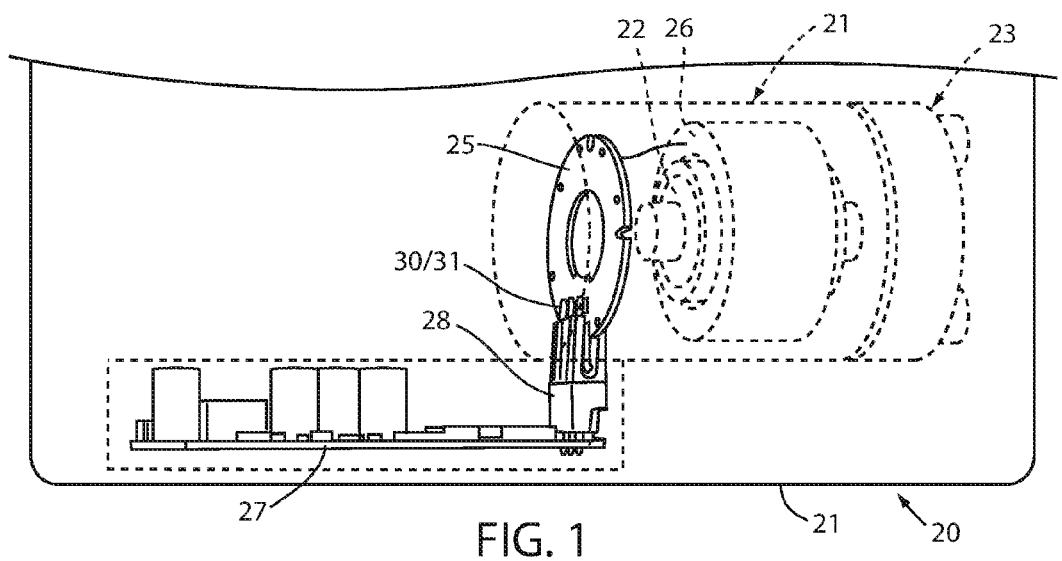
FIGS. 1-1A are side views, partially schematic, showing an ATF motor/pump apparatus submersed in automatic transmission fluid inside a transmission fluid pan, the motor including a stator circuit board connected to a controller circuit board, the controller circuit board including an edge-of-board electrical connector (called "edge connector") with tuning-fork-like conductors for engaging mating conductive pads along an edge of the stator circuit board, FIGS. 1 and 1A showing the motor extending in different orientations (i.e. opposite directions).
Figure 1A:
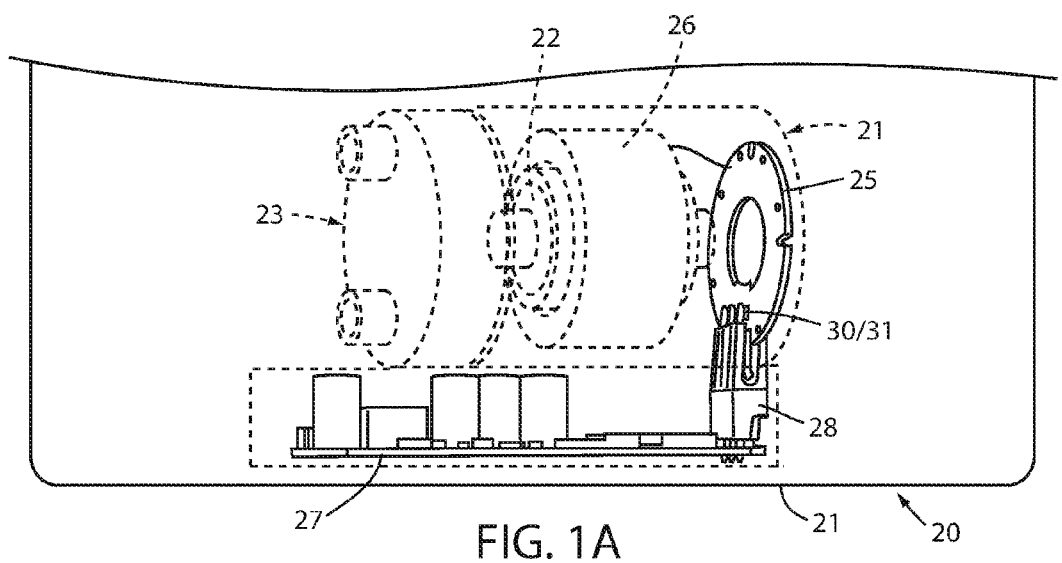
Figure 2:
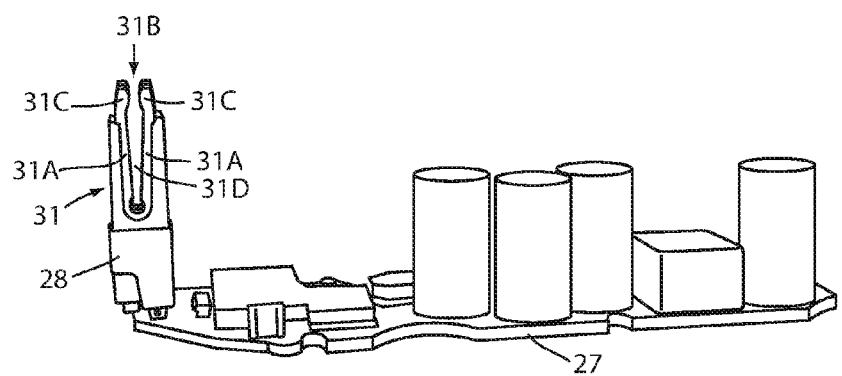
FIG. 2 is a side view of the controller circuit board and circuit-board-attached edge connector of FIG. 1.

The present apparatus 20 (FIG. 1) is illustrated as positioned in a transmission fluid pan 21 partially filled with transmission fluid, and includes a motor 21 with rotor 22 driving a pump 23 for pumping the automatic transmission fluid to various vehicle components. The motor 21 has a stator circuit board 25 integral to the motor and operably connected to its stator 26, a controller circuit board 27 separate from the stator circuit board 25, and a connector 28 on the controller circuit board 27 for electrically (and mechanically) connecting to a connecting arrangement of pads 30 on the stator circuit board 25 to connect to different circuits between the circuit boards 25 and 27 to control operation of the motor's rotor via phases U, V and W. The pads 30 on the stator circuit board 25 comprise enlarged spots of conductive material on opposing sides of the stator circuit board 25 near an edge of the circuit board 25. For convenience, the pads 30 are referred to herein as a "connector arrangement", since the pads 30 are arranged to provide connection and also provide frictional retention force by engaging the arms of the tuning-fork-like conductors 31 in the connector 28. In a broadest sense, in the illustrated apparatus, it should be understood that there is no traditional connector on the controlling circuit board 27.

Figure 4:
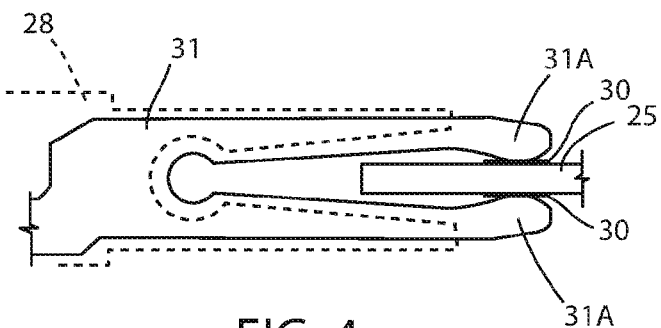
FIG. 4 is a cross-sectional view showing the electrical connection provided by the tuning-fork-like conductors to the pads on the stator circuit board.
Figure 3:
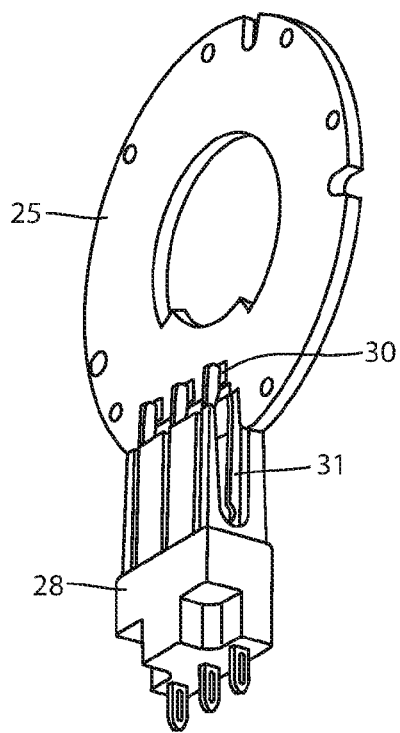
FIG. 3 is a perspective view of the edge connector engaging the pads on the (circle-shaped) stator circuit board.
Figure 5:
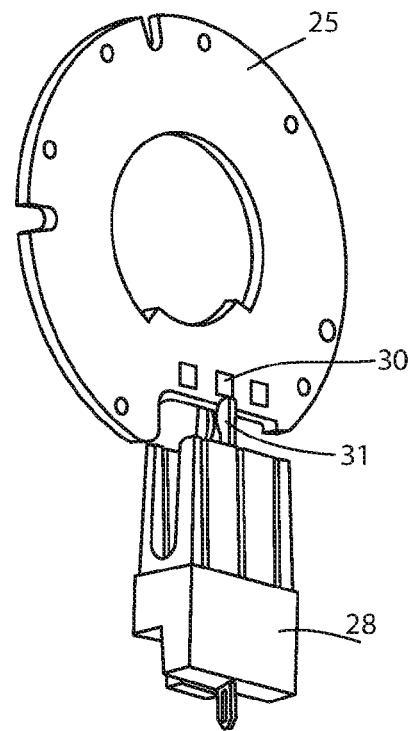
FIG. 5 is an exploded view of FIG. 3 (with only the center one conductor 31 shown).
Figure 9:
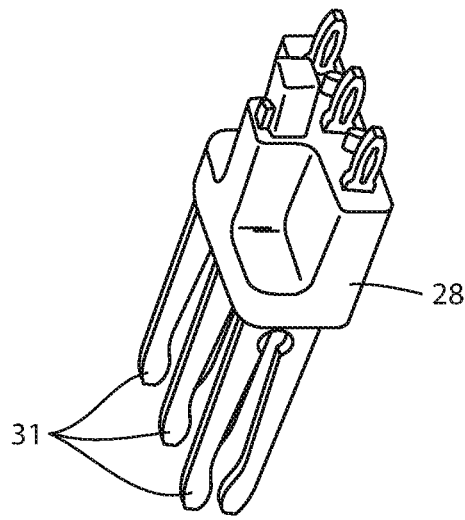
FIGS. 9-13 are views of the edge connector of FIG. 3, FIG. 9 being a perspective view, FIGS. 10-12 being orthogonal views, and FIG. 13 being a cross section showing the conductor inside the non-conductive plastic material of the edge connector.
Figure 10:
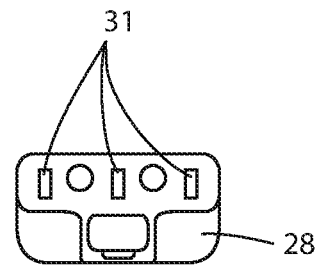
Figure 11:
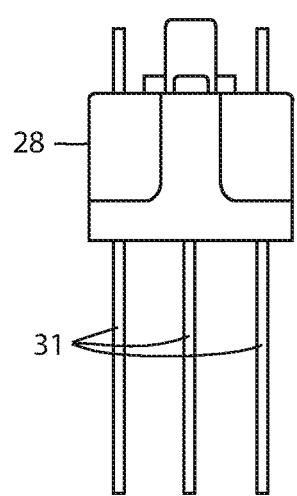
Figure 12:
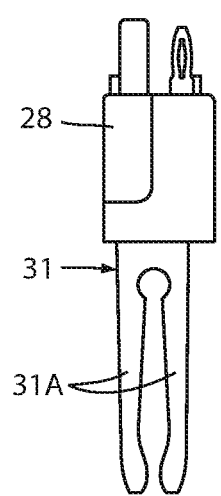
Figure 13:
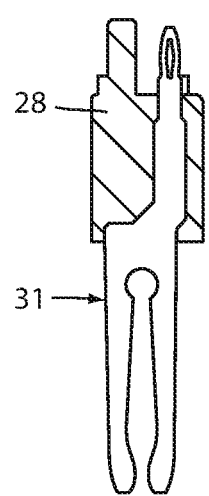

The connector 28 is shown in FIGS. 1 and 4, which shows the assembly, and is shown in FIGS. 6-8 which shows the conductors 31, and in FIGS. 10-13 which show the connector 28 with conductors 31. The connector 28 includes a molded non-conductive body (of plastic) holding multiple tuning-fork-like conductors 31 (three shown) in parallel positions each defining an entrance "jaw" corresponding to the pads 30. This arrangement allows for elimination of the socket header used in the prior art connector 101 described above and shown in FIGS. 18-21, which is a tremendous cost savings in material, assembly cost, and savings in space consumption. The conductors 31 have conductive arms 31A that extend in a parallel direction, with the angled inner surfaces of the arms forming a funnel-shaped entrance 31B (which facilitates blind assembly onto the edge of the stator circuit board 25), inwardly protruding bumps 31C (which create a pinch point promoting good electrical connection to the pads 30 and also positive frictional retention forces on the pads 30 on opposing sides of the stator circuit board 25), and a spaced inner portion 31D (for receiving the edge of the stator circuit board 25. It is noted that the quality and surety of the electrical connection is greatly increased due to the electrical contact with pads 30 on opposite sides of the stator circuit board 25.

FIG. 1 shows a particular arrangement where the motor's stator and rotor are shown extending away from the controller circuit board. However, this is done for convenience and illustrative clarity, but it is contemplated that the motor's stator and rotor can extend in any direction relative to each other.

Skilled artisans will understand that a variety of different materials and constructions are possible while staying within a scope of the present innovative concepts. The illustrated stator board 25 is a laminate type, the conductors 31 are a conductive metal having a Young's modulus of 131 GPa, and the terminal housing (plastic body of the connector 29) is a material having a Young's modulus of 10 GPa. The install force for assembly and retention forces for the assembly can be varied in a number of ways, such as for example by changing materials, treating the contacting surfaces with surface treatment (e.g. plating or coatings), and/or changing a shape of the conductor arms 31A (i.e. changing the angle of the funnel entrance and/or of a dimension and shape of the pinch point and/or flexibility/resiliency of the arms). The illustrated prototype successfully passed several tests, including tests of lower install/higher retention forces, electrical integrity/ampacity, thermal shock, powered vibration with heat, and powered thermal cycle. It is noted that the present illustrated connection has operated effectively while communicating 20 amps or more.

The present arrangement is particularly useful in sensorless ATF (automatic transmission fluid) motors used to drive pumps for pumping automatic transmission fluid, because it provides a very compact design (needed for the small space requirements in a vehicle transmission pan), while maintaining or improving reliability and cost effectiveness (needed for the high quality standards required in modern vehicles). The present assembly provides for robust, positive, and relatively easy connection (even in a blind assembly), provides excellent reliability upon connection (including excellent duplicative electrical contact and also mechanical resistance to pull-apart), while using a minimum of number of components (due in part to eliminating one of the connectors used in traditional mating-pin-and-socket electrical connectors) and while also using low cost components and low cost assembly techniques/processes. It is contemplated that the above innovative aspects can include a device connected to and driven by the motor(s), such as any fluid pump or air pump device, a power steering device, an AC compressor, a motor-powered power brake, and substantially any motor-powered component or accessory used in a vehicle or in a larger assembly.

Figure 17:
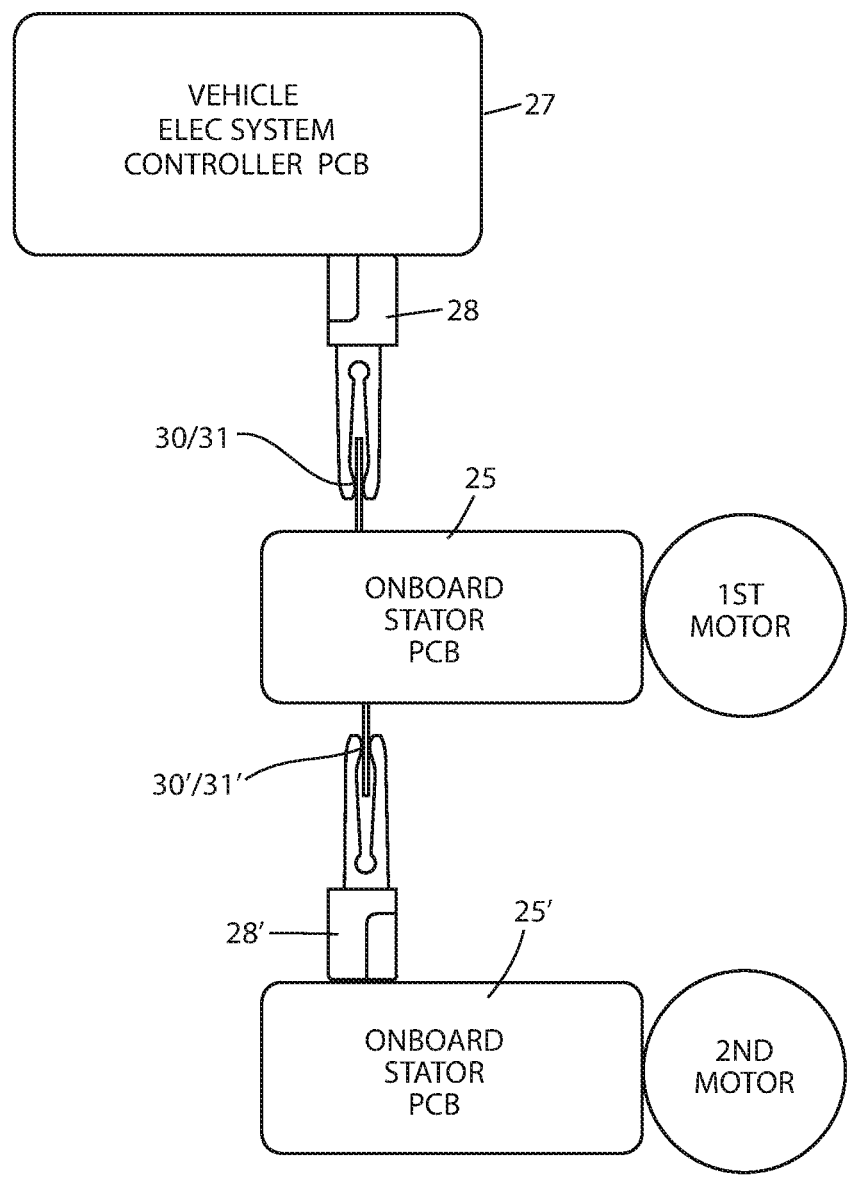
FIG. 17 is a schematic showing a vehicle electrical system including a controller PCB connected using tuning-fork-connectors to conductive pads on a 1st on-board static motor PCB, and including a $2^{nd}$ on-board static motor PCB connected using tuning-fork-connectors to conductive pads on the $1^{st}$ on-board static motor PCB.
Figure 17A:
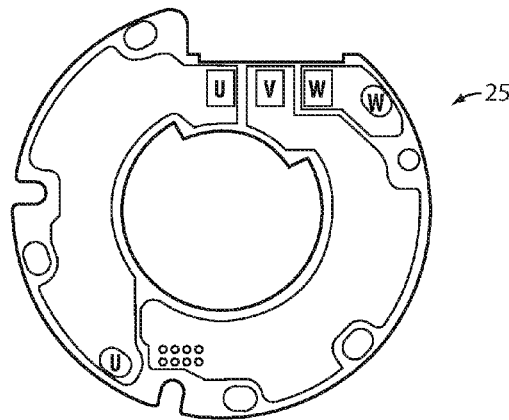
FIGS. 17A-17D are layers of the stator circuit board, the layers showing redundant pads connected to circuits on the stator circuit board, the redundant pads causing redundant connection of the controller and stator circuit boards to improve sureness and robustness of the electrical connection.
Figure 17B:
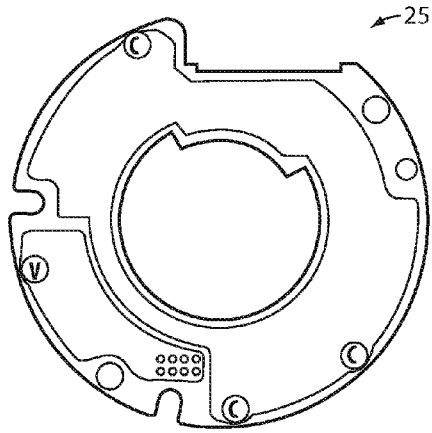
Figure 17C:
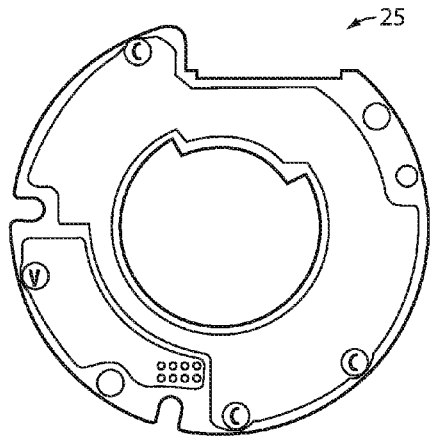
Figure 17D:
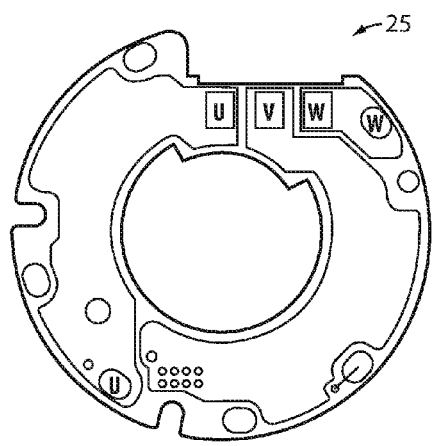

FIG. 17 is a schematic showing an alternative circuit comprising a vehicle electrical system including a controller PCB 27 connected using tuning-fork-connectors 28 with arm-like conductors 31 engaging conductive pads 30 on a 1st on-board static motor PCB 25, and including a $2^{nd}$ on-board static motor PCB 25' connected using tuning-fork-connectors 28' with conductors 31' engaging conductive pads 30' on an edge 25' of the $1^{st}$ on-board static motor PCB 25. It is contemplated that variations are within a scope of the present invention. For example, both on-board static motor PCB's could be connected directly to the controller PCB, with both tuning-fork-connectors being on the controller PCB and with the conductive pads along the $1^{st}$ and $2^{nd}$ on-board static motor PCBs. Also, the tuning-fork-connectors could be on the static motor PCB's, and the conductive pads along the edge of the controller PCB. It is contemplated that additional tuning-fork-connectors could be used to connect PCB's while minimizing or eliminating pre-assembled/pre-manufactured electrical connector components.

FIGS. 17A-17D show adjacent layers of the stator circuit board 25, where the layers include redundant pads (identified as items C, U, V, W) connected to circuits on the stator circuit board, the redundant pads causing redundant connection of the controller and stator circuit boards to improve sureness and robustness of the electrical connection.

It is to be understood that variations and modifications can be made on the aforementioned structure without departing from the concepts of the present invention, and further it is to be understood that such concepts are intended to be covered by the following claims unless these claims by their language expressly state otherwise.

The embodiments of the invention in which an exclusive property or privilege is claimed are defined as follows:

1. A pump for mounting in a vehicle and providing a pumping action for fluid carried on the vehicle, the pump comprising:
   a motor having a stator and a rotor, the stator provided on a stator circuit board;
   a controller circuit board forming part of a vehicle's electrical control system; and
   an apparatus for electrically connecting the stator on the stator circuit board to control circuitry on the controller circuit board, the apparatus comprising:
      one of the stator circuit board and the controller circuit board including an edge with spaced-apart pads of electrically-conductive material for connecting the stator and control circuitry; and
      the other of the stator circuit board and the controller circuitry including an edge connector with conductors each having at least one protruding arm positioned to both engage the pads for electrical contact and also frictionally engage the pads for mechanical retention,
      wherein the at least one protruding arm on each of the conductors includes opposing arms that define a pinch point therebetween, the pinch point being dimensioned to cause the opposing, arms to each contact and frictionally engage an associated one of the pads, and
      wherein the apparatus does not include any mechanical connecting structure creating a substantial retention force other than the retention force created by the conductors on the pads.

2. The apparatus of claim 1, wherein the pads extend parallel to a plane defined by one of the first and second circuit boards and are formed on a surface of the one circuit board.

3. A method for electrically connecting a motor's on-board stator circuit board to a controller circuit board, comprising:
   providing on one of the stator circuit board and the controller circuit board, an edge with spaced-apart pads of electrically-conductive material for connecting to the multiple electrical circuits;
   providing on the other of the stator circuit board and the controller circuit board, an edge connector with conductors each having at least one protruding arm positioned to engage the pads; and
   assembling the edge connector onto the edge so that the conductors electrically engage the pads for electrical contact and also frictionally engage the pads for mechanical retention,
   wherein the at least one protruding arm on each of the conductors includes opposing arms that define a pinch point therebetween, the pinch point being dimensioned to cause the opposing arms to each contact and frictionally engage an associated one of the pads,
   wherein the apparatus does not include any mechanical connecting structure creating a substantial retention force other than the retention force created by the conductors on the pads.

4. The method of claim 3, wherein the pads include opposing pads formed on opposing sides of one of the circuit boards, the opposing pads extending parallel to a plane defined by the one circuit board.

5. The apparatus of claim 1, wherein the pads include first pads on one side and second pads on an opposite side that are aligned with and associated with the first pads and are arranged to form redundant electrical connections with the conductors of the edge connector.

6. The method of claim 3, including providing a motor, and wherein the one circuit board comprises the stator circuit board, the stator circuit board being operably attached to and supported by the motor.

7. The method of claim 6, wherein the controller circuit board forms part of a vehicle's electrical control system.

8. The method of claim 7, wherein the pads are arranged to form redundant electrical connections with the conductors of the edge connector.

9. The method of claim 3, including providing a vehicle accessory providing a vehicle function including one of a pumping action and a mechanical movement, the vehicle accessory being operably connected to the motor for being operated by the motor.

10. The method of claim 9, wherein the vehicle function includes a pump providing the pumping action for fluid carried on the vehicle.

* * * * *